United States Patent
Komoto

(10) Patent No.: US 6,191,992 B1
(45) Date of Patent: Feb. 20, 2001

(54) FIRST-IN-FIRST-OUT STORAGE DEVICE INCLUDING SYNCHRONIZED FULL-STATE DETENTION AND EMPTY-STATE DETENTION

(75) Inventor: Eiji Komoto, Tokyo (JP)

(73) Assignee: OKI Electric Industry Co., Ltd, Tokyo (JP)

( * ) Notice: Under 35 U.S.C. 154(b), the term of this patent shall be extended for 0 days.

(21) Appl. No.: 09/221,588

(22) Filed: Dec. 29, 1998

(30) Foreign Application Priority Data

Jan. 21, 1998 (JP) .................................................. 10-009531

(51) Int. Cl.[7] ....................................................... G11C 7/00
(52) U.S. Cl. ............................ 365/221; 365/233; 365/239
(58) Field of Search .................................... 365/221, 205, 365/223, 233, 239

(56) References Cited

U.S. PATENT DOCUMENTS

| | | | |
|---|---|---|---|
| 5,220,529 | * 6/1993 | Kohiyama et al. | 365/189.01 |
| 5,473,756 | * 12/1995 | Traylor | 365/221 |
| 5,555,524 | * 9/1996 | Castellano | 365/221 |
| 5,587,953 | * 12/1996 | Chung | 365/221 |
| 5,956,748 | * 9/1999 | New | 711/149 |

* cited by examiner

Primary Examiner—Amir Zarabian
Assistant Examiner—VanThu Nguyen
(74) Attorney, Agent, or Firm—Jones Volentine, L.L.C.

(57) ABSTRACT

The first-in first-out storage device has a write counter for counting as a write address the number of data write operations of a write side circuit, a read counter for counting as a read address a number of data read operations of a read side circuit, a RAM which stores data input from the write side circuit into a storage region that corresponds to the write address when the write side circuit has performed the write operation and outputs the data stored in the storage region that corresponds to the read address to the read side circuit when the read side circuit has performed the read operation, a full-state detection unit which detects whether the write operation of the write side circuit needs to be restricted or not based on the write address and read address, a flip-flop which outputs a detection result obtained by the full-state detection unit to the write side circuit in synchronization with a write clock signal based on which the write side circuit operates, an empty-state detection unit which detects whether the read operation of the read side circuit needs to be restricted or not based on the write address and read address, and another flip-flop which outputs a detection result obtained by the empty-state detection unit to the read side circuit in synchronization with a write clock signal based on which the write side circuit operates.

8 Claims, 7 Drawing Sheets

FIRST-IN-FIRST-OUT STORAGE DEVICE INCLUDING SYNCHRONIZED FULL-STATE DETENTION AND EMPTY-STATE DETENTION

BACKGROUND OF THE INVENTION

1. Field of the Invention

The present invention relates to a first-in first-out storage device (this will be referred to as a FIFO in what follows) which sequentially stores data input from a write-side circuit and sequentially outputs the stored data to a read-side circuit in accordance with the order the data has been stored.

2. Description of Related Art

FIG. 1 is a block diagram showing the configuration of a conventional FIFO. This FIFO has a random access memory (RAM) 51 for temporarily storing data such that the time required to access a randomly selected datum does not depend on the time of the last access or the location of the most recently accessed datum, terminals 11, 12, 13, and 14 connected to a write-side circuit not shown in FIG. 1, a write counter 15, a full-state detection unit 16, terminals 21, 22, 23, and 24 connected to a read-side circuit not shown in FIG. 1, a read counter 25, and an empty-state detection unit 26.

Write-data WD to be stored in the RAM 51 is input from the write-side circuit to the terminal 11. A write control signal /WREQ ("/" indicates an inverted logic) is input to the terminal 12 from the write-side circuit. A write clock signal WCLK is input to the terminal 13 from the write-side circuit. The terminal 14 outputs a full-state signal FUL to the write-side circuit.

The terminal 21 outputs read data RDATA to the read-side circuit. A read control signal /RREQ is input to the terminal 22 from the read-side circuit. A read clock signal RCLK is input to the terminal 23 from the read-side circuit. The terminal 24 outputs an empty-state signal EMP to the read-side circuit.

The RAM 51 has a data terminal WD, a write control terminal /WE, a write address terminal WA, a read data terminal RD, and a read address terminal RA. The data terminal WD, write control terminal /WE, write address terminal WA, read data terminal RD, and read address terminal RA are connected to the terminals 11, 12, output-side terminal of the write-counter 15, terminal 21, and output-side terminal of the read-counter 25, respectively.

When the write control signal /WREQ input to the write control terminal /WE is a "L (LOW)" signal, that is, when the write-side circuit sends a write-instruction to the RAM 51, 1-word data input to the write data terminal WD is written in a storage region of the RAM 51 that corresponds to a write address WADR input to the write address terminal WA. The RAM 51 outputs the data stored in its storage region that corresponds to an address signal input to the read address terminal RA to the terminal 21 from the read data terminal RD. The RAM 51 has an 8-word storage region, for example, ranging from storage location 0 to storage location 7. By using storage location 0 to storage location 7 cyclically, the RAM 51 can hold up to 8-word data.

The write counter 15 has a clock terminal C connected to the terminal 13, an enable terminal /E connected to the terminal 12, and an output terminal connected to the input terminal of the full-state detection unit 16 and write address terminal WA of the RAM 51. When the write control signal /WREQ input to the enable terminal /E is an "L" signal, that is, when a write-instruction signal is input from the write-side circuit, the write counter 15 counts the write address WADR one by one in synchronization with the rise of the clock signal WCLK input from the clock terminal C and outputs the write address WADR from the output terminal. The write counter 15 outputs, for example, a write address WADR having one more bit than the number of bits required to represent the real address of the storage region of the RAM 51.

The read counter 25 has a clock terminal C connected to the terminal 23, an enable terminal /E connected to the terminal 22, and an output terminal for outputting counted values. The output terminal is connected to the input terminal of the empty-state detection unit 26, input terminal of the full-state detection unit 16, and read address terminal RA of the RAM 51. When the read control signal /RREQ input to the enable terminal /E is an "L" signal, that is, when a read-instruction signal is supplied to the read counter 25, the read counter 25 counts the write address RADR one by one in synchronization with the rise of the read clock signal RCLK input from the clock terminal C and outputs the read address RADR from the output terminal. The read counter 25 outputs, for example, a read address RADR having one more bit than the number of bits required to represent the real address of the storage region of the RAM 51.

The full-state detection unit 16 has two input terminals and one output terminal connected to the terminal 14. One of the two input terminals is connected to the output terminal of the write counter 15, and the other input terminal is connected to the output terminal of the read counter 25. The full-state detection unit 16 detects that the entire storage region of the RAM 51 is filled with effective data by comparing the write address WADR input from the write counter 15 with the read address RADR input from the read counter 25. Here, when the information of the bits of the write address WADR excluding its leading bit is identical to the information of the bits of the read address RADR excluding its leading bit, the storage region to be written next is the same as the storage region to be read next. In this case, if the information of the leading bit of the write address WADR differs from the information of the leading bit of the read address RADR, it means that the number of written data is larger than the number of read data. Hence, the full-state detection unit 16 detects that the entire storage region of the RAM 51 is filled with effective data and outputs a full-state signal FUL as an "H (HIGH)" signal.

The empty-state detection unit 26 has two input terminals and one output terminal connected to the terminal 24. One of the two input terminals is connected to the output terminal of the write counter 15, and the other input terminal is connected to the output terminal of the read counter 25. The empty-state detection unit 26 detects that the storage region of the RAM 51 has no effective data by comparing the write address WADR input from the write counter 15 with the read address RADR input from the read counter 25.

Here, when the information of the bits of the write address WADR excluding its leading bit is identical to the information of the bits of the read address RADR excluding its leading bit, the storage region to be written next is the same as the storage region to be read next. In this case, if the information of the leading bit of the write address WADR is identical to the information of the leading bit of the read address RADR, it means that the number of written data is equal to the number of read data. Hence, the empty-state detection unit 26 detects that the storage region of the RAM 51 has no effective data and outputs an empty-state signal EMP as an "H (HIGH)" signal.

Next, the basic operation of the conventional FIFO will be explained. When a write control signal /WREQ as an "L"

signal, a write clock signal WCLK, and a write data signal WDATA are supplied from the write side circuit by a write operation of the write side circuit to the FIFO, the write counter 15 counts up the write address WADR. In addition, the RAM 51 stores the write data WDATA in the storage region that corresponds to the write address WADR that has already been output by the write counter 15.

On the other hand, when a read control signal /RREQ as a "L" signal and a read clock signal RCLK are supplied from the read-side circuit by the read operation of the read-side circuit, the read counter 15 counts up the read address RADR. In addition, the RAM 51 outputs as read data RDATA the data in the storage region that corresponds to the read address RADR that has already been output by the read counter 25. In this way, the stored data is output in accordance with the order the data has been stored.

The write operation is performed sequentially until the entire storage region of the RAM 51 is filled with data. When the entire storage region of the RAM 51 is filled with data, the information of all the bits but the leading bit of the write address WADR becomes identical to the information of all the bits but the leading bit of the read address RADR. The information of the leading bit of the write address WADR differs from the information of the leading bit of the read address RADR. Hence, the full-state detection unit 16 detects that the entire region of the RAM 51 is filled with effective data, and outputs a full-state signal FUL as an "H" signal. Thus, the full-state signal FUL as an "H" signal is output to the write side circuit via the terminal 14, and the write operation of the write side circuit is stopped.

The read operation is performed sequentially until the entire storage region of the RAM 51 becomes empty. When the entire storage region of the RAM 51 becomes empty, the information of all the bits of the write address WADR becomes identical to the information of all the bits of the read address RADR. The information of the leading bit of the write address WADR thus becomes equal to the information of the leading bit of the read address RADR. Hence, the empty-state detection unit 26 detects that the entire region of the RAM 51 has no data, and outputs an empty-state signal EMP as an "H" signal. Thus, the empty-state signal EMP as an "H" signal is output to the read side circuit via the terminal 24, and the read operation of the read side circuit is stopped.

However, the above-described conventional FIFO has the following problems. FIG. 2 is a time chart showing an exemplary operation sequence of the conventional FIFO. When the frequency or phase of the clock signal in accordance with which the write side circuit operates differs from the frequency or phase of the clock signal in accordance with which the read side circuit operates, the following problematic states are generated. As shown by line A in FIG. 2, the fall of the empty-state signal EMP is displaced from the rise of the read clock signal RCLK. As shown by line B in FIG. 2, the fall of the full-state signal FUL is displaced from the rise of the write clock signal WCLK. As shown by line C in FIG. 2, the pulse width is narrow and the fall of the empty-state signal EMP is displaced from the rise of the read clock signal RCLK.

As a result of these problematic states, the information contained in the full-state signal FUL is not properly transmitted to the write side circuit, and the information contained in the empty-state signal EMP is not properly transmitted to the read side circuit. For example, when the write side circuit has a set of multiple circuits which operate in parallel, if one circuit controls the restriction of the write operation in accordance with the full-state signal FUL and the other circuits cannot control the restriction of the write operation in accordance with the full-state signal FUL, this set of multiple circuits cannot operate in parallel.

SUMMARY OF THE INVENTION

Given these problems, it is an object of the present invention to provide a first-in first-out storage device capable of solving these problems. The object of the present invention can be achieved by a combination of characteristics described in the independent claims of the present invention. Moreover, the dependent claims of the present invention determine further advantageous embodiments of the present invention.

According to the first aspect of the invention, a first-in first-out storage device (FIFO) which sequentially stores data input from a write side circuit and outputs the data to a read side circuit in accordance with the order the data has been stored is provided. This FIFO has a write counter for counting as a write address the number of write operations in which the write side circuit writes the data, a read counter for counting as a read address the number of read operations in which the read side circuit reads the data, a memory which stores the data input from the write side circuit into a storage region that corresponds to the write address when the write side circuit has performed the write operation and outputs the data stored in a storage region that corresponds to the read address to the read side circuit when the read side circuit has performed the read operation, a full-state detection unit which detects whether the write operation of the write side circuit needs to be restricted or not based on the write address and read address, and a synchronization circuit which outputs the detection result obtained by the full-state detection unit to the write side circuit in synchronization with a write clock signal based on which the write side circuit operates.

In this FIFO, the write counter may count the write address based on the write clock signal input from the write side circuit when a write-instruction signal is input from the write side circuit. The read counter may count the read address based on a read clock signal input from the read side circuit when a read-instruction signal is input from the read side circuit. The full-state detection unit may detect whether the entire storage regions of the memory are entirely filled with effective data or not so as to detect whether the write operation needs to be restricted or not.

The FIFO may further have multiple registers which take in values of the read address at different points in time based on a reference signal synchronized with an operation of the write side circuit, and an agreement detection unit which detects whether the values of the read address that the multiple registers hold are in agreement or not such that the synchronization circuit outputs said detection result obtained by the full-state detection unit to the write side circuit when the agreement detection unit detects that the values of the read address are in agreement. The multiple registers may take in values of the read address at different points in time based on a write clock signal input from the write side circuit. The multiple registers may be two registers, in which case one is a first register which takes in the read address in synchronization with the write clock signal and the other is a second register which takes in a read address held in the first register in synchronization with the write clock signal.

The FIFO may further have a divider which divides a read clock signal input from the read side circuit in accordance with a prescribed ratio and a register which holds the read address in synchronization with the read clock signal divided by the divider. In this case, the full-state detection unit detects whether the write operation of the write side circuit needs to be restricted or not based on the write address and read address held by the register.

According to the second aspect of the invention, another first-in first-out storage device (FIFO) which sequentially stores data input from a write side circuit and outputs the data to read side circuit in accordance with the order the data has been stored is provided. This FIFO has a write counter for counting a write address based on a write clock signal input from the write side circuit when a write-instruction signal is input from the write side circuit, a read counter for counting a read address based on a read clock signal input from the read side circuit when a read-instruction signal is input from the read side circuit, a memory which stores the data input from the write side circuit into a storage region that corresponds to the write address when the write side circuit performs the write operation and outputs the data stored in a storage region that corresponds to the read address to the read side circuit when the read side circuit performs the read operation, a synchronization circuit which outputs said read-instruction signal in synchronization with the write clock signal when the read-instruction signal is input, a counter which counts a read correspondence address based on the write clock signal when the synchronized read-instruction signal is input, and a full-state detection unit which detects whether the write operation of the write side circuit needs to be restricted or not based on the write address and read correspondence address.

The FIFO may further have an empty-state detection unit which detects whether the read operation of the read side circuit needs to be restricted or not based on the write address and read address and a second synchronization circuit which outputs the detection result obtained by the empty-state detection unit to the read side circuit in synchronization with a read clock signal based on which the read side circuit operates.

The FIFO may further have an empty-state detection unit which detects whether the read operation of the read side circuit needs to be restricted or not based on the write address and read address, multiple registers which take in values of the write address at different points in time based on a reference signal synchronized with an operation of the read side circuit, an agreement detection unit which detects whether the values of the write address that the multiple registers hold are in agreement or not, and a second synchronization circuit which outputs a detection result obtained by the empty-state detection unit to the read side circuit in synchronization with a read clock signal based on which the read side circuit operates when the agreement detection unit detects that the values of the write address are in agreement.

The FIFO may further have an empty-state detection unit which detects whether the read operation of the read side circuit needs to be restricted or not based on the write address and read address, multiple registers which take in values of the write address at different points in time based on a reference signal synchronized with an operation of the read side circuit, a second agreement detection unit which detects whether the values of the write address held in the multiple registers for taking in the write address are in agreement or not, and a second synchronization circuit which outputs a detection result obtained by the empty-state detection unit to the read side circuit in synchronization with a read clock signal based on which the read side circuit operates when the second agreement detection unit detects that the values of the write address are in agreement.

The FIFO may further have an empty-state detection unit which detects whether the read operation of the read side circuit needs to be restricted or not based on the write address and the read address, and a second synchronization circuit which outputs a detection result obtained by the empty-state detection unit to the read side circuit in synchronization with a read clock signal based on which the read side circuit operates.

The FIFO may further have a second divider which divides the write clock signal input from the write side circuit in accordance with a prescribed ratio, a second register which holds the write address in synchronization with the write clock signal divided by the second divider, and an empty-state detection unit which detects whether the read operation of the read side circuit needs to be restricted or not based on the write address held by the second register and read address.

The FIFO may further have a second synchronization circuit which outputs the write-instruction signal in synchronization with the read clock signal when the write-instruction signal is input, a second counter which counts a write correspondence address based on the read clock signal when the synchronized write-instruction signal is input, and an empty-state detection unit which detects whether the read operation of the read side circuit needs to be restricted or not based on the write correspondence address and said read address.

According to the third aspect of the invention, further another first-in first-out storage device (FIFO) which sequentially stores data input from a write side circuit and outputs the data to a read side circuit in accordance with the order the data has been stored is provided. This FIFO has a write counter for counting as a write address a number of write operations in which the write side circuit writes the data, a read counter for counting as a read address a number of read operations in which said read side circuit reads said data, a memory which stores the data input from the write side circuit into a storage region that corresponds to the write address when the write side circuit performs the write operation and outputs the data stored in a storage region that corresponds to the read address to the read side circuit when the read side circuit performs the read operation, an empty-state detection unit which detects whether the read operation of the read side circuit needs to be restricted or not based on the write address and read address, and a synchronization circuit which outputs a detection result obtained by the empty-state detection unit to the read side circuit in synchronization with a read clock signal based on which the read side circuit operates.

In the FIFO, the write counter may count the write address based on the write clock signal input from the write side circuit when a write-instruction signal is input from the write side circuit. The read counter may count the read address based on the read clock signal input from the read side circuit when a read-instruction signal is input from the read side circuit. The empty-state detection unit may detect whether the read operation needs to be restricted or not by detecting whether effective data exits in the storage region of the memory or not.

The FIFO may further have multiple registers which take in values of the write address at different points in time based on a reference signal synchronized with an operation of said read side circuit, and an agreement detection unit which detects whether the values of the write address that the multiple registers hold are in agreement or not. In this case, the synchronization circuit outputs the detection result obtained by the empty-state detection unit to the read side circuit when the agreement detection unit detects that the values of the write address are in agreement. The multiple registers may take in values of the write address at different points in time based on the read clock signal input from the read side circuit. The number of multiple registers may be two, in which case, one is a first register which takes in the write address in synchronization with the read clock signal and the other is a second register which takes in the write address held in the first register in synchronization with the read clock signal.

The FIFO may further have a divider which divides a write clock signal input from the write side circuit in accordance with a prescribed ratio and a register which holds the write address in synchronization with the write clock signal divided by the divider. In this case, the empty-state detection unit detects whether the read operation of the read side circuit needs to be restricted or not based on the write address held by the register and read address.

According to the fourth aspect of the invention, further another first-in first-out storage device (FIFO) which sequentially stores data input from a write side circuit and outputs the data to a read side circuit in accordance with the order the data has been stored is provided. This FIFO has a write counter for counting as a write address a number of write operations in which the write side circuit writes the data, a read counter for counting as a read address a number of read operations in which the read side circuit reads the data, a memory which stores the data input from the write side circuit into a storage region that corresponds to the write address when the write side circuit performs the write operation and outputs the data stored in a storage region that corresponds to the read address to the read side circuit when the read side circuit perform the read operation, a synchronization circuit which outputs a write-instruction signal in synchronization with a read clock signal when the write-instruction signal is input, a counter which counts a write correspondence address based on the read clock signal when the synchronized write-instruction signal is input, and an empty-state detection unit which detects whether the read operation of the read side circuit needs to be restricted or not based on the read address and write correspondence address.

Moreover, the above-described summary of the present invention does not list all the essential characteristics of the present invention. Sub-combinations of these characteristics also are covered by the scope of the present invention.

DETAILED DESCRIPTION OF THE INVENTION

In what follows, the present invention will be explained with embodiments of the present invention. However, the following embodiments do not restrict the scope of the invention described in the claims. Moreover, not all the combinations of the characteristics of the present invention described in the embodiments are essential to the problem solving means by the present invention.

A FIFO according to the first embodiment of the present invention will be explained with reference to FIG. 3.

Figure 3:
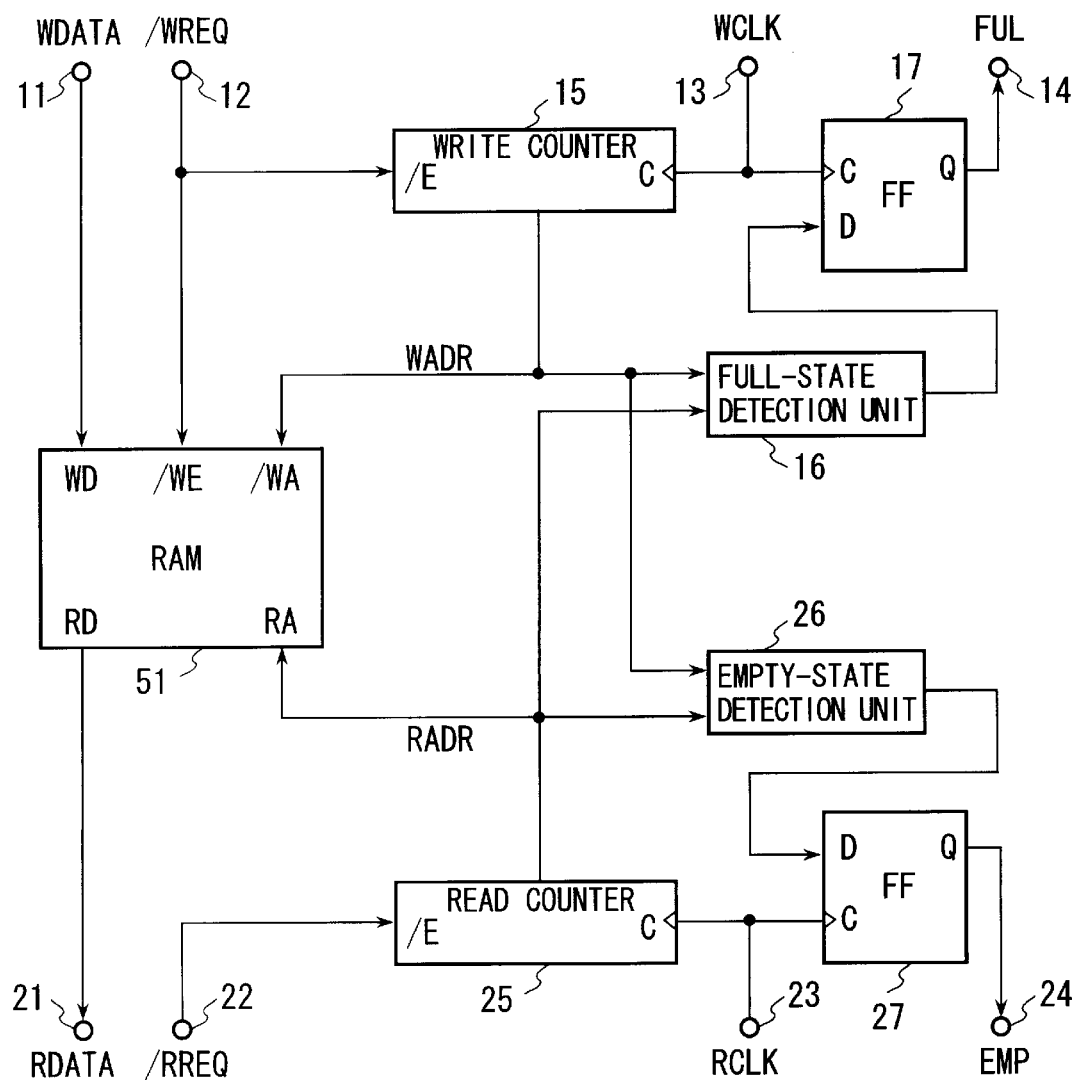
FIG. 3 is a block diagram showing the configuration of a FIFO according to the first embodiment of the present invention.

FIG. 3 is a block diagram showing the configuration of a FIFO according to the first embodiment of the present invention. This FIFO has a RAM 51, terminals 11, 12, 13, and 14 connected to a write side circuit not shown in FIG. 3, a write counter 15, a full-state detection unit 16, a first flip flop 17 (this will be referred to as FF in the following) as an exemplary synchronization circuit, terminals 21, 22, 23, and 24 connected to a read side circuit not shown in FIG. 3, a read counter 25, an empty-state detection unit 26, and a second FF 27.

Write-data WD to be stored in the RAM 51 is input from the write-side circuit to the terminal 11. A write control signal /WREQ ("/" indicates an inverted logic) is input to the terminal 12 from the write-side circuit. A write clock signal WCLK is input to the terminal 13 from the write-side circuit. The terminal 14 outputs a full-state signal FUL to the write-side circuit.

The terminal 21 outputs read data RDATA to the read-side circuit. A read control signal /RREQ is input to the terminal 22 from the read-side circuit. A read clock signal RCLK is input to the terminal 23 from the read-side circuit. The terminal 24 outputs an empty-state signal EMP to the read-side circuit.

The RAM 51 has a data terminal WD, a write control terminal /WE, a write address terminal WA, a read data terminal RD, and a read address terminal RA. The data terminal WD, write control terminal /WE, write address terminal WA, read data terminal RD, and read address terminal RA are connected to the terminals 11, 12, output-side terminal of the write-counter 15, terminal 21, and output-side terminal of the read-counter 25, respectively.

When the write control signal /WREQ input to the write control terminal /WE is a "L (LOW)" signal, that is, when the write-side circuit sends a write-instruction to the RAM 51, 1-word data input to the write data terminal WD is written on the storage region of the RAM 51 that corresponds to the write address WADR input to the write address terminal WA. The RAM 51 outputs the data stored in the storage region that corresponds to the address signal input to the read address terminal RA to the terminal 21 from the read data terminal RD. The RAM 51 has an 8-word storage region, for example, ranging from storage location 0 to storage location 7. By using storage location 0 to storage location 7 cyclically, the RAM 51 can hold up to 8-word data.

The write counter 15 has a clock terminal C connected to the terminal 13, an enable terminal /E connected to the terminal 12, and an output terminal connected to the input terminal of the full-state detection unit 16 and write address terminal WA of the RAM 51. When the write control signal /WREQ input to the enable terminal /E is an "L" signal, that is, when a write-instruction signal is input from the write-side circuit, the write counter 15 counts up the write address WADR one by one in synchronization with the rise of the clock signal WCLK input from the clock terminal C and outputs the write address WADR from the output terminal. The write counter 15 outputs, for example, a write address WADR having one more bit than the number of bits required to represent the real address of the storage region of the RAM 51.

The read counter 25 has, a clock terminal C connected to the terminal 23, an enable terminal /E connected to the terminal 22, and an output terminal connected to the input terminal of the empty-state detection unit 26, input terminal of the full-state detection unit 16 and read address terminal RA of the RAM 51.

When the read control signal /RREQ input to the enable terminal /E is an "L" signal, that is, when a read-instruction signal is supplied to the read counter 25, the read counter 25 counts up the write address RADR one by one in synchronization with the rise of the read clock signal RCLK input from the clock terminal C and outputs the read address RADR from the output terminal. The read counter 25 outputs, for example, a read address RADR having one more bit than the number of bits required to represent the real address of the storage region of the RAM 51.

The full-state detection unit 16 has two input terminals and one output terminal. The output terminal is connected to the data terminal D of the FF 17. One of the two input terminals is connected to the output terminal of the write counter 15, and the other input terminal is connected to the output terminal of the read counter 25. The full-state detection unit 16 detects that the entire storage region of the RAM 51 is filled with effective data by comparing the write address WADR input from the write counter 15 with the read address RADR input from the read counter 25.

Here, when the information of the bits of the write address WADR excluding its leading bit is identical to the information of the bits of the read address RADR excluding its leading bit, the storage region to be written next is the same as the storage region to be read next. In this case, if the information of the leading bit of the write address WADR differs from the information of the leading bit of the read address RADR, it means that the number of written data is larger than the number of read data. Hence, the full-state detection unit 16 detects that the entire storage region of the RAM 51 is filled with effective data and outputs a full-state signal FUL as an "H(HIGH)" signal to the first FF 17.

The FF first 17 has a clock terminal C, a data terminal D, and an output terminal Q. The clock terminal C is connected to the terminal 13. The data terminal D is connected to the output side terminal of the full-state detection unit 16. The output terminal Q is connected to the terminal 14. The first FF 17 receives a signal from the full-state detection unit 16 and outputs the signal from the output terminal Q as a full-state signal FUL in synchronization with the write clock signal WCLK input from the clock terminal C.

The empty-state detection unit 26 has two input terminals and one output terminal. One of the two input terminals is connected to the output terminal of the write counter 15, and the other input terminal is connected to the output terminal of the read counter 25. The output terminal is connected to the data terminal D of the second FF 27. The empty-state detection unit 26 detects that the storage region of the RAM 51 has no effective data by comparing the write address WADR input from the write counter 15 with the read address RADR input from the read counter 25.

Here, when the information of the bits of the write address WADR excluding its leading bit is identical to the information of the bits of the read address RADR excluding its leading bit, the storage region to be written next is the same as the storage region to be read next. In this case, if the information of the leading bit of the write address WADR is identical to the information of the leading bit of the read address RADR, it means that the number of written data is equal to the number of read data. Hence, the empty-state detection unit 26 detects that the storage region of the RAM 51 has no effective data and outputs an empty-state signal EMP as an "H (HIGH)" signal to the second FF 27.

The second FF 27 has a clock terminal C, a data terminal D, and an output terminal Q. The clock terminal C is connected to the terminal 23. The data terminal D is connected to the output side terminal of the empty-state detection unit 26. The output terminal Q is connected to the terminal 24. The second FF 27 receives a signal from the empty-state detection unit 26 and outputs the signal from the output terminal Q as an empty-state signal EMP in synchronization with the read clock signal RCLK input from the clock terminal C.

Next, the basic operation of the FIFO according to the first embodiment will be explained. When a write control signal /WREQ as an "L" signal, a write clock signal WCLK, and a write data signal WDATA are supplied from the write side circuit by a write operation of the write side circuit to the FIFO, the write counter 15 counts up the write address WADR. In addition, the RAM 51 stores the write data WDATA in the storage region that corresponds to the write address WADR that has already been output by the write counter 15.

On the other hand, when a read control signal /RREQ as a "L" signal and a read clock signal RCLK are supplied from the read-side circuit by a read operation of the read-side circuit, the read counter 25 counts up the read address RADR. In addition, the RAM 51 outputs as read data RDATA the data stored in the storage region that corresponds to the read address RADR that has already been output by the read counter 25. In this way, the stored data is output in accordance with the order the data has been stored.

The write operation is performed sequentially until the entire storage region of the RAM 51 is filled with data. When the entire storage region of the RAM 51 is filled with data, the information of all the bits but the leading bit of the write address WADR becomes identical to the information of all the bits but the leading bit of the read address RADR. The information of the leading bit of the write address WADR differs from the information of the leading bit of the read address RADR. Hence, the full-state detection unit 16 detects that the entire region of the RAM 51 is filled with effective data, and outputs a full-state signal FUL as an "H" signal to the first FF 17. The first FF 17 then outputs the "H" signal input from the full-state detection unit 16 as a full-state signal FUL to the write side circuit via the output terminal 14. Thus, the full-state signal FUL having a sufficient length that is in synchronization with the write clock signal WCLK is sent to the write side circuit. In this way, the write side apparatus properly obtains the information of the full-state signal FUL.

The read operation is performed sequentially until the entire storage region of the RAM 51 becomes empty. When the entire storage region of the RAM 51 becomes empty, the information of all the bits of the write address WADR becomes identical to the information of all the bits of the read address RADR. The information of the leading bit of the write address WADR thus becomes equal to the information of the leading bit of the read address RADR. Hence, the empty-state detection unit 26 detects that the entire region of the RAM 51 has no data, and outputs an empty-state signal EMP as an "H" signal to the second FF 27. Next, the second FF 27 outputs the empty-state signal EMP as an "H" signal to the read side circuit via the output terminal 24 in synchronization with the read clock signal RCLK input via the terminal 23.

In this way, the empty-state signal EMP synchronized with the read clock signal RCLK is sent to the read side circuit, and the read side circuit properly obtains the information of the empty-state signal EMP.

Figure 4:
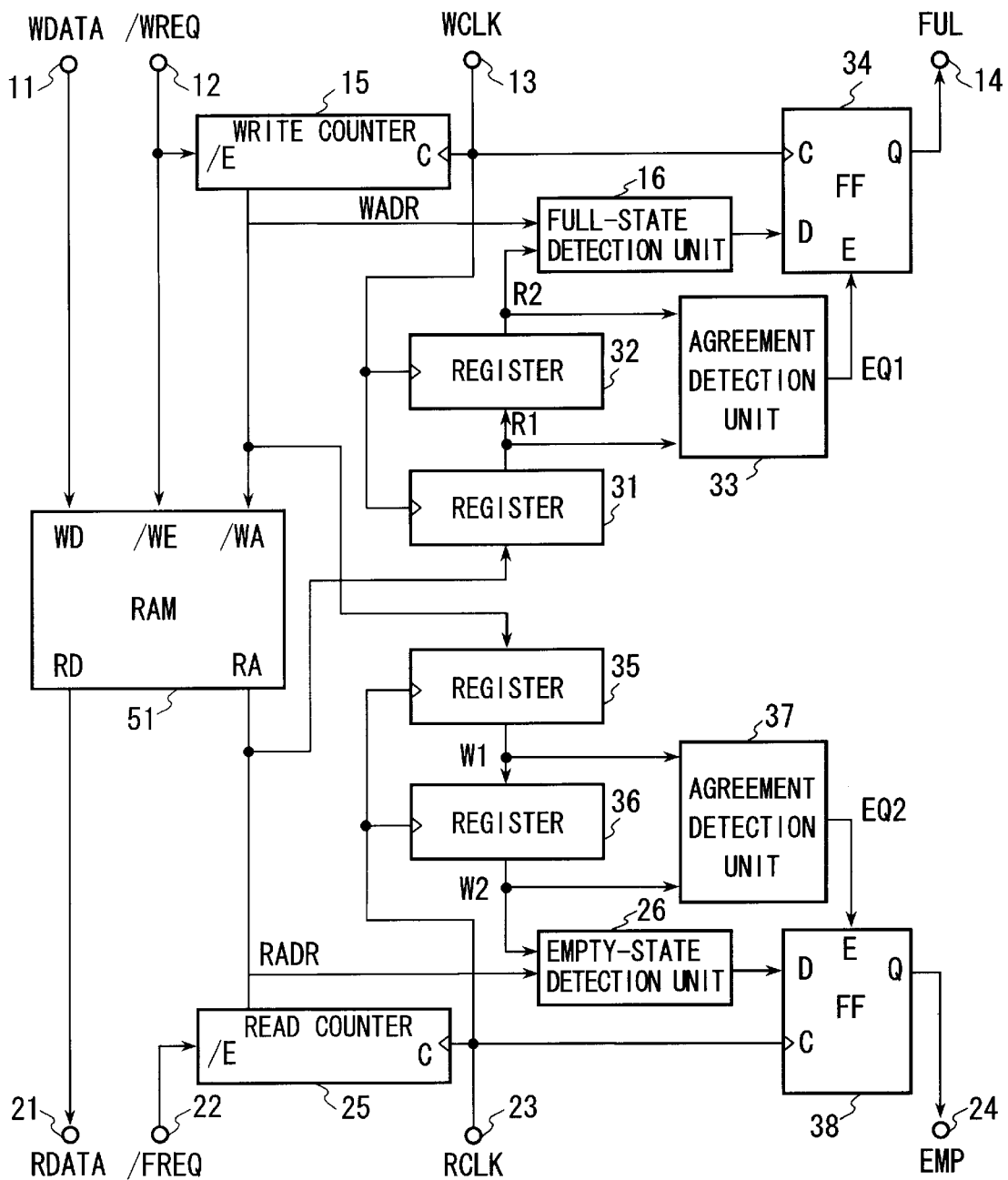
FIG. 4 is a block diagram showing the configuration of a FIFO according to the second embodiment of the present invention.

FIG. 4 is a block diagram showing the configuration of the FIFO according to the second embodiment. The same reference numerals are assigned to those components that are already used in the first embodiment shown in FIG. 3. Such components will not be explained again here. This FIFO is constructed by installing four registers 31, 32, 35, and 36, and two agreement detection units 33 and 37 in the FIFO according to the first embodiment, and by installing in the FIFO according to the first embodiment FF 34 and FF 37 in place of the FF 17 and FF 27, respectively.

The register 31 has two input terminals and one output terminal. One of the two input terminals is connected to the terminal 13. The other input terminal is connected to the output side terminal of the read counter 25. The output terminal is connected to one input terminal of the register 32 and one input terminal of the agreement detection unit 33. The register 31 receives a read address RADR at the other input terminal in synchronization with a write clock signal WCLK input at the one input terminal, and outputs the received address as an address signal R1 to the register 32 and agreement detection unit 33 from the output terminal.

The register 32 has two input terminals and one output terminal. One of the two input terminals is connected to the terminal 13. The other input terminal is connected to the output terminal of the register 31. The output terminal is connected to one input terminal of the full-state detection unit 16 and one input terminal of the agreement detection unit 33. The register 32 receives the address signal R1 supplied from the register 31 via the other input terminal in synchronization with the write clock signal WCLK input via the one input terminal, and outputs the received address as an address signal R2 to the full-state detection unit 16 and agreement detection unit 33 from the output terminal.

The agreement detection unit 33 has two input terminals and one output terminal. One of the two input terminals is connected to the output terminal of the register 31. The other input terminal is connected to the output terminal of the register 32. The output terminal is connected to the enable terminal E of the FF 34. The agreement detection unit 33 compares the address R1 input from the register 31 with the address R2 input from the register 32. If the addresses R1 and R2 are in agreement, the agreement detection unit 33 outputs an agreement detection signal EQ1 as an "H" signal to the FF 34. Thus, the agreement detection unit 33 compares the two addresses R1 and R2, which have been obtained at different points in time from the read counter 25, to examine whether they are equal or not so as to confirm that the obtained addresses are not invalid values generated during the count operation of the read counter 25.

The FF 34 has been constructed by installing an enable terminal E in the FF 17 shown in FIG. 3. This enable terminal E is connected to the output terminal of the agreement detection unit 33. When the "H" level agreement detection signal EQ1 is input to the enable terminal E from the agreement detection unit 33, the FF 34 performs the same operation as the FF 17.

The register 35 has two input terminals and one output terminal. One of the two input terminals is connected to the terminal 23. The other input terminal is connected to the output side terminal of the write counter 15. The output terminal is connected to one input terminal of the register 36 and one input terminal of the agreement detection unit 37. The register 35 receives the write address WADR via the other input terminal in synchronization with a read clock signal RCLK input via the one input terminal, and outputs the received address to the register 36 and agreement detection unit 37 as an address W1 from the output terminal.

The register 36 has two input terminals and one output terminal. One of the two input terminals is connected to the terminal 23. The other input terminal is connected to the output terminal of the register 35. The output terminal is connected to one input terminal of the empty-state detection unit 26 and one input terminal of the agreement detection unit 37. The register 36 receives the address W1 via the other input terminal in synchronization with a read clock signal RCLK input via the one input terminal, and outputs the received address to the empty-state detection unit 26 and agreement detection unit 37 as an address W2 from the output terminal.

The agreement detection unit 37 has two input terminals and one output terminal. One of the two input terminals is connected to the output terminal of the register 35. The other input terminal is connected to the output terminal of the register 36. The output terminal is connected to the enable terminal E of the FF 38. The agreement detection unit 37 compares the address W1 input from the register 35 with the address W2 input from the register 36. If the addresses W1 and W2 are in agreement, the agreement detection unit 37 outputs an agreement detection signal EQ2 as an "H" signal to the FF 38. Thus, the agreement detection unit 37 compares the two addresses W1 and W2, which have been obtained at different points in time from the write counter 15, to examine whether they are equal or not so as to confirm that the obtained addresses are not invalid values generated during the count operation of the write counter 15.

The FF 38 has been constructed by installing an enable terminal E in the FF 27 shown in FIG. 3. This enable terminal E is connected to the output terminal of the agreement detection unit 37. When the "H" level agreement detection signal EQ2 is input to the enable terminal E from the agreement detection unit 37, the FF 38 performs the same operation as the FF 27.

Next, the operation of the FIFO according to the second embodiment will be explained.

Figure 5:
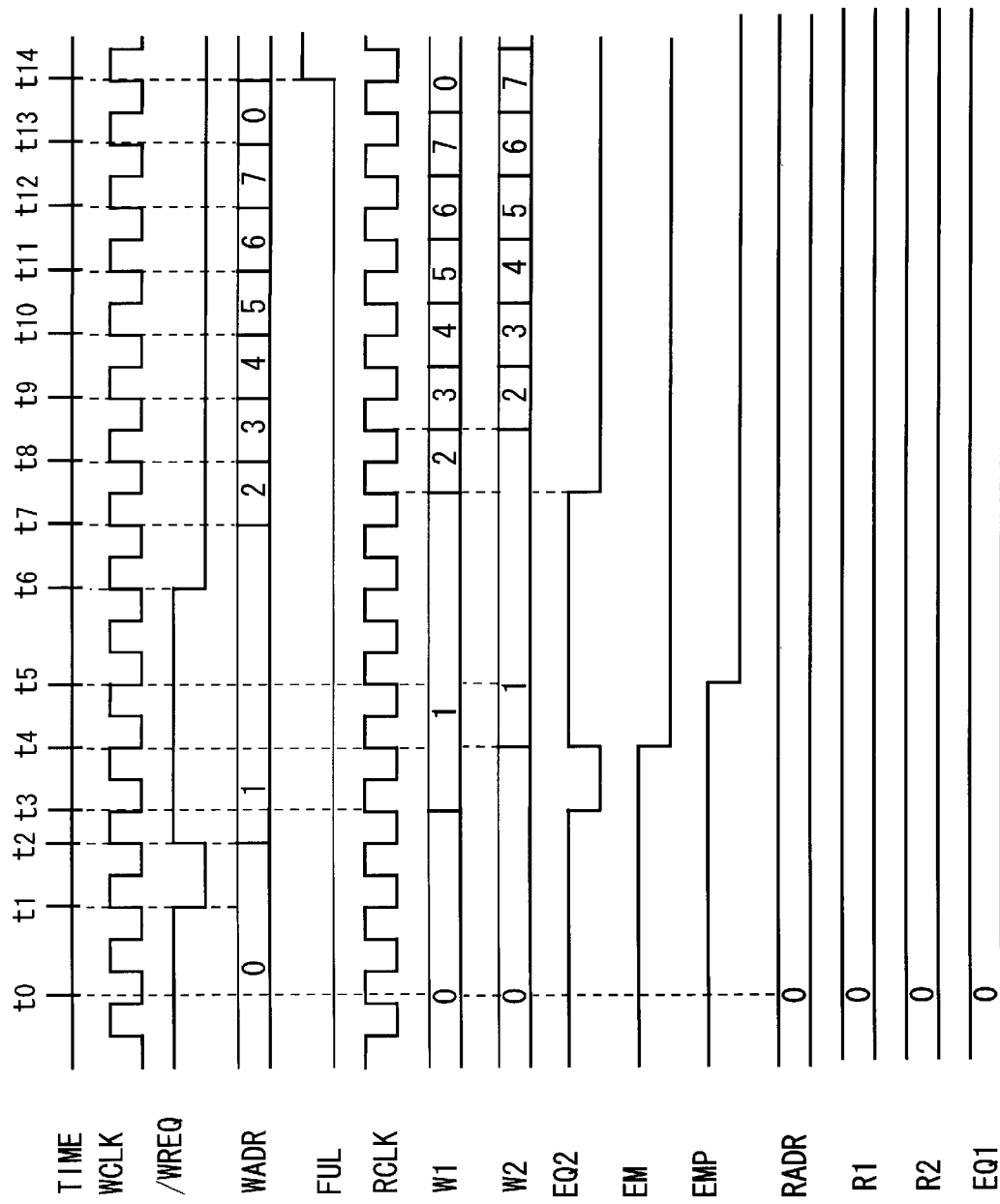
FIG. 5 is a time chart showing an exemplary operation sequence of the FIFO according to the second embodiment of the present invention.

FIG. 5 is a time chart showing an exemplary operation sequence of the FIFO according to the second embodiment.

At time t0, the counters 15 and 25 and registers 31, 32, 35, and 36 are reset, the values of all of which are "0". In FIG. 5, the values of all the bits but the leading bit of each of the counters 15 and 25 and registers 31, 32, 35, and 36 are expressed by decimal numbers. Both the write control signal /WREQ and read control signal /RREQ are "H" signals. In this case, the empty-state detection unit 26 is outputting an "H" signal EM, and the FF 38 is outputting an "H" empty-state signal EMP.

When the write control signal /WREQ changes to an "L" signal at time t1, the RAM 51 writes the write data WDATA input from the terminal 11 onto the storage location that corresponds to the write address WADR output from the write counter 15 (that is, in the storage location 0).

When the write clock signal WCLK rises at time t2, the write counter 15 counts up the write address WADR and sets the write address WADR to "1".

When the read clock signal RCLK rises at time t3, the value W1 of the register 35 becomes "1".

When the read clock signal RCLK rises at time t4, the values W1 and W2 of the registers 35 and 36 both become "1". The agreement detection unit 37 then outputs an "H" agreement detection signal EQ2. Since the value W2 of the register 36 is "1" and the value of the read counter RADR is "0", the empty-state detection unit 26 outputs an "L" signal.

When the read clock signal RCLK rises at time t5, the FF 38 outputs an "L" empty-state signal EMP to the read side circuit via the terminal 24 in synchronization with the read clock signal RCLK.

When the write control signal /WREQ changes to an "L" signal at time t6, the RAM 51 writes the write data WDATA input from the terminal 11 in the storage location that corresponds to the write address WADR output from the write counter 15 (that is, in the storage location 1).

When the write clock signal WCLK rises at time t7, the write counter 15 counts up the write address WADR and sets the write address WADR to "2".

When the write clock signal WCLK rises at time t8 through t12, the write counter 15 counts up the write address WADR and sequentially sets the write address WADR to "3", "4", "5", "6", and "7", respectively. These values form the values of the bits but the leading bit of the write address WADR. On the other hand, since the read address RADR has remained unchanged at "0", the value R1 of the register 31 and the value R2 of the register 32 are both "0", and the agreement detection unit 33 is outputting an "H" agreement detection signal EQ1.

When the write clock signal WCLK rises at time t13, the write counter 15 counts up the write address WADR in synchronization with the rise of the write clock signal WCLK. As a result, the values of all the bits but the leading bit of the write address WADR become 0. In this case, the values of all the bits but the leading bit of the write address WADR input to the full-state detection unit 16 and the values of all the bits of R2 but the leading bit of R2, which is the value of the register 32, are all "0". The value of the leading bit of the write address WADR differs from the value of the leading bit of the value R2 of the register 32. Therefore, the full-state detection unit 16 outputs an "H" signal which indicates that the entire storage region of the RAM 51 is filled with data.

At t14, in synchronization with the rise of the write clock signal WCLK, the FF 34 outputs an "H" full-state signal FUL to the write side circuit via the terminal 14.

Thus, in addition to the same effects of the FIFO of the first embodiment has, the FIFO according to the second embodiment prevents a false full-state state FUL or empty-state signal EMP from being output by an invalid value generated during the count operation of the write counter 15 or read counter 25, respectively.

Figure 6:
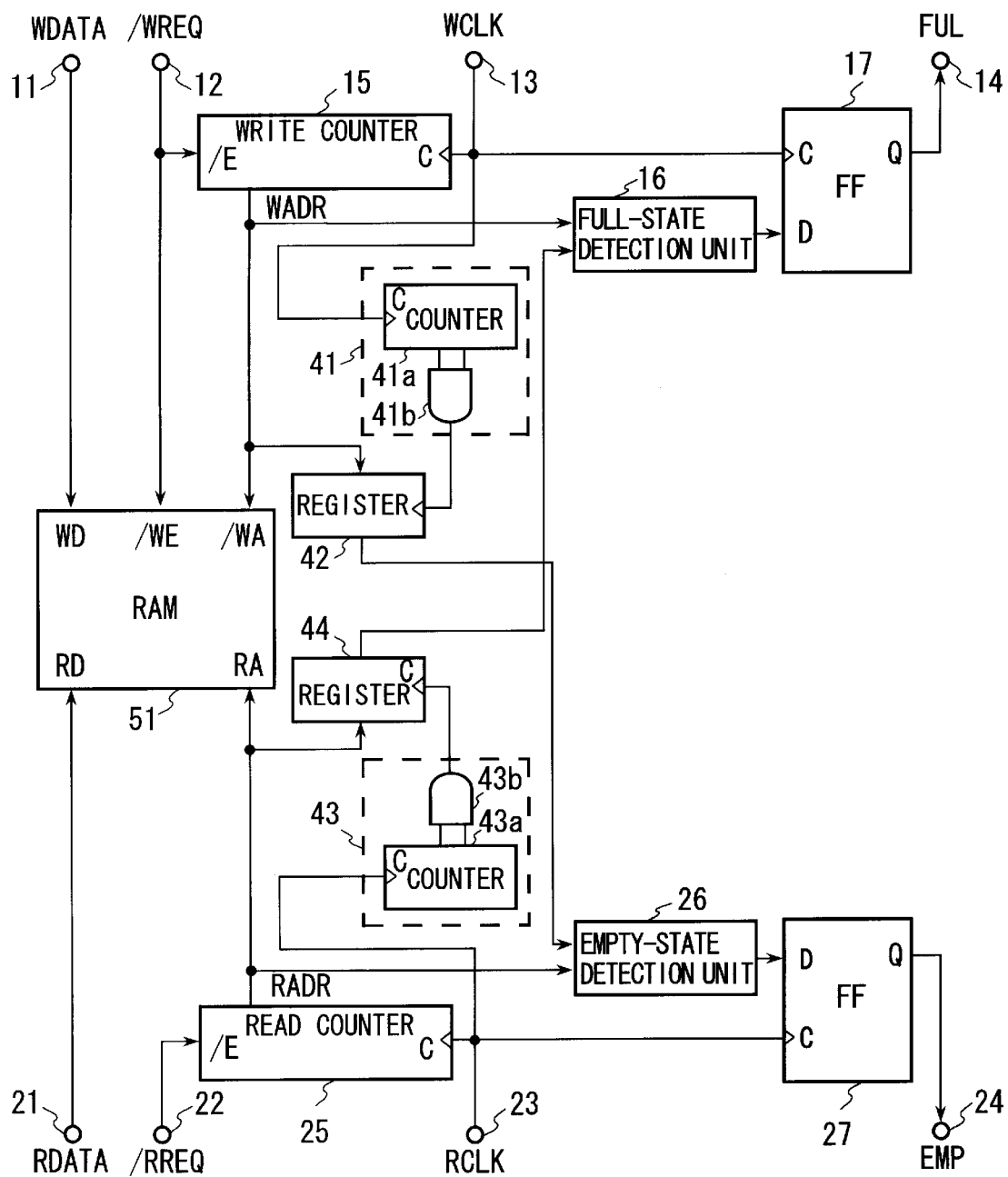
FIG. 6 is a block diagram showing the configuration of a FIFO according to the third embodiment of the present invention.

Next, a FIFO according to the third embodiment of the present invention will be explained. FIG. 6 is a block diagram showing the configuration of the FIFO according to the third embodiment. The same reference numerals are assigned to those components that are already used in the first embodiment shown in FIG. 3. This FIFO is constructed by further installing registers 42 and 44 and dividers 41 and 43 in the FIFO according to the first embodiment.

The divider 41 has a counter 41a and a logic product gate (this will be referred to as AND in the following) 41b. The counter 41a is, for example, a 2-digit binary counter having one clock terminal C and two output terminals. The clock terminal C of the counter 41a is connected to the terminal 13. The two output terminals of the counter 41a are connected to corresponding input terminals of the AND 41b. The counter 41a counts up one by one in synchronization with the rise of a write clock signal WCLK input from the clock terminal C, and outputs a signal that corresponds to the value of each digit from the corresponding output terminal.

The AND 41b has two input terminals and one output terminal. These two input terminals are connected to the corresponding output terminals of the counter 41a, respectively. This output terminal is connected to the clock terminal C of the register 42. The AND 41b performs a logic multiplication of the values input from the two input terminals and outputs a signal corresponding to the logic product from the output terminal.

Therefore, the divider 41 causes a signal to rise for every four cycles of the write clock signal WCLK and outputs the signal. In other words, the divider 41 divides the write clock signal WCLK and outputs the divided signal.

The register 42 has a clock terminal C, one input terminal and one output terminal. This input terminal is connected to the output terminal of the write counter 15. This clock terminal C is connected to the output terminal of the AND 41b of the divider 41. This output terminal is connected to one input terminal of the empty-state detection unit 26. The register 42 outputs a write address signal WADR output from the write counter 15 to the empty-state detection unit 26 in synchronization with the divided write clock signal WCLK input from the divider 41.

The divider 43 has a counter 43a and an AND 43b. The counter 43a is, for example, a 2-digit binary counter having one clock terminal C and two output terminals. The clock terminal C of the counter 43a is connected to the terminal 23. The two output terminals of the counter 43a are connected to corresponding input terminals of the AND 43b. The counter 43a counts up one by one in synchronization with the rise of a read clock signal RCLK input from the clock terminal C, and outputs a signal that corresponds to the value of each digit from the corresponding output terminal.

The AND 43b has two input terminals and one output terminal. These two input terminals are connected to the corresponding output terminals of the counter 43a, respectively. This output terminal is connected to the clock terminal C of the register 44. The AND 43b performs a logic multiplication of the values input from the two input terminals and outputs a signal corresponding to the logic product from the output terminal. Therefore, the divider 43 causes a signal to rise for every four cycles of the read clock signal RCLK and outputs the signal. In other words, the divider 43 divides the read clock signal RCLK and outputs the divided signal.

The register 44 has one clock terminal C, one input terminal and one output terminal. This input terminal is connected to the output terminal of the read counter 25. This clock terminal C is connected to the output terminal of the AND 43b of the divider 43. This output terminal is connected to one input terminal of the empty-state detection unit 16. The register 44 outputs a read address signal RADR output from the read counter 25 to the empty-state detection unit 16 in synchronization with the divided read clock signal RCLK input from the divider 43.

Next, the operation of the FIFO according to the third embodiment will be explained. Since this FIFO reads data from the RAM 51 and writes data on the RAM 51 in the same manner as the FIFO of the first embodiment, the read and write operations of this FIFO will not be explained here.

Here, an operation for outputting a full-state signal FUL that is performed in parallel with the data write operation performed for the RAM 51, an operation for outputting an empty-state signal EMP that is performed in parallel with the data read operation performed for the RAM 51, and the difference between these operations and the corresponding operations of the FIFO of the first embodiment will be explained.

In this FIFO, the divider 43 first divides a read clock signal RCLK supplied from the read side circuit. The register 44 obtains a read address RADR from the counter 25 in synchronization with the divided signal and outputs the read address RADR to the full-state detection unit 16. Therefore, the probability that invalid values generated during the count operation of the read counter 25 will be input to the full-state detection unit 16 can be reduced in comparison with the FIFO of the first embodiment. Hence, a false full-state signal FUL is prevented from being output.

In addition, in this FIFO, the divider 41 first divides a write clock signal WCLK supplied from the write side circuit. The register 42 then obtains a write address WADR from the write counter 15 in synchronization with the divided signal, and outputs the write address WADR to the empty-state detection unit 26. Therefore, the probability that invalid values generated during a count operation of the write counter 15 will be input to the empty-state detection unit 26 can be reduced in comparison with the FIFO of the first embodiment. Hence, a false empty-state signal EMP is prevented from being output.

Figure 1:
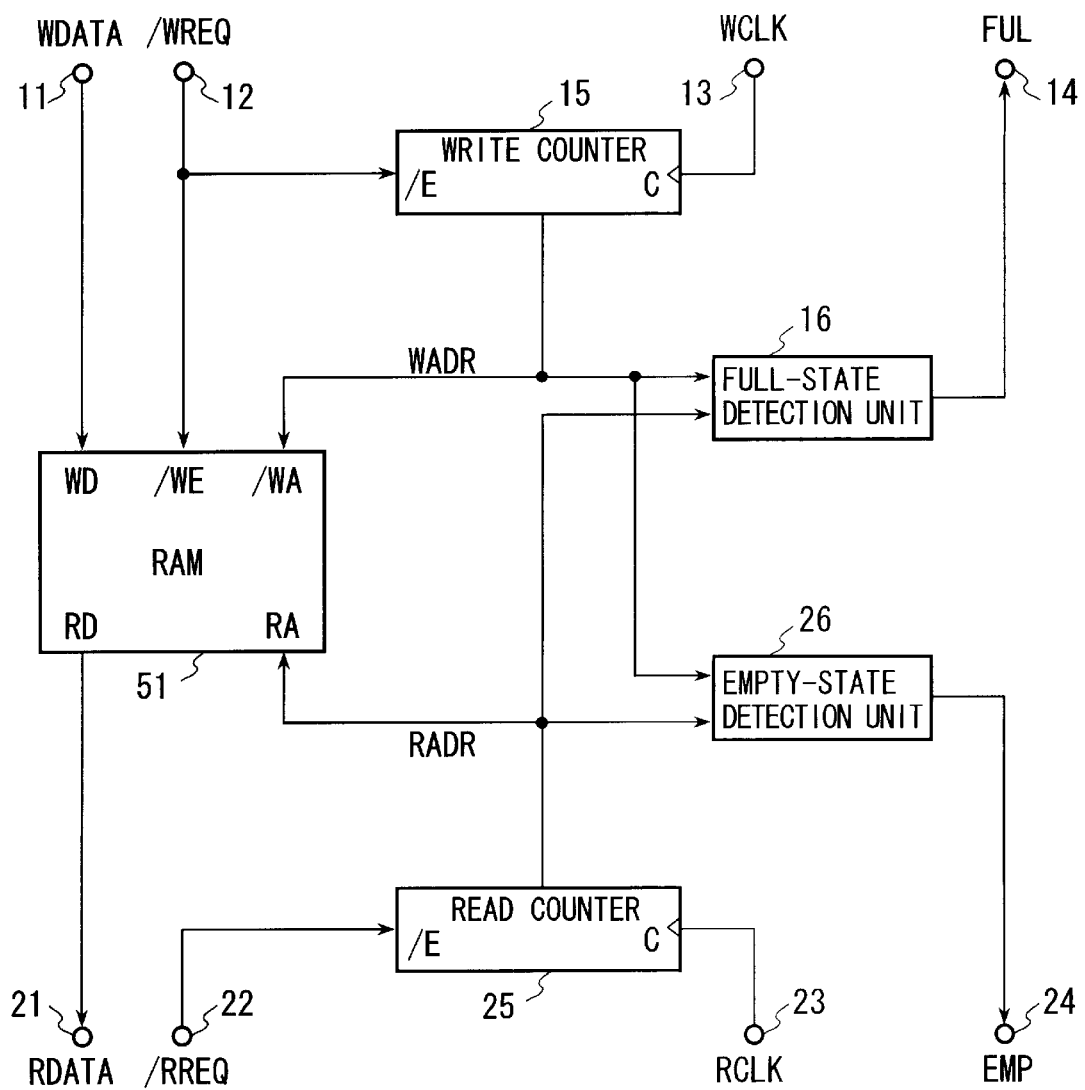
FIG. 1 is a block diagram showing the configuration of a conventional FIFO.
Figure 2:
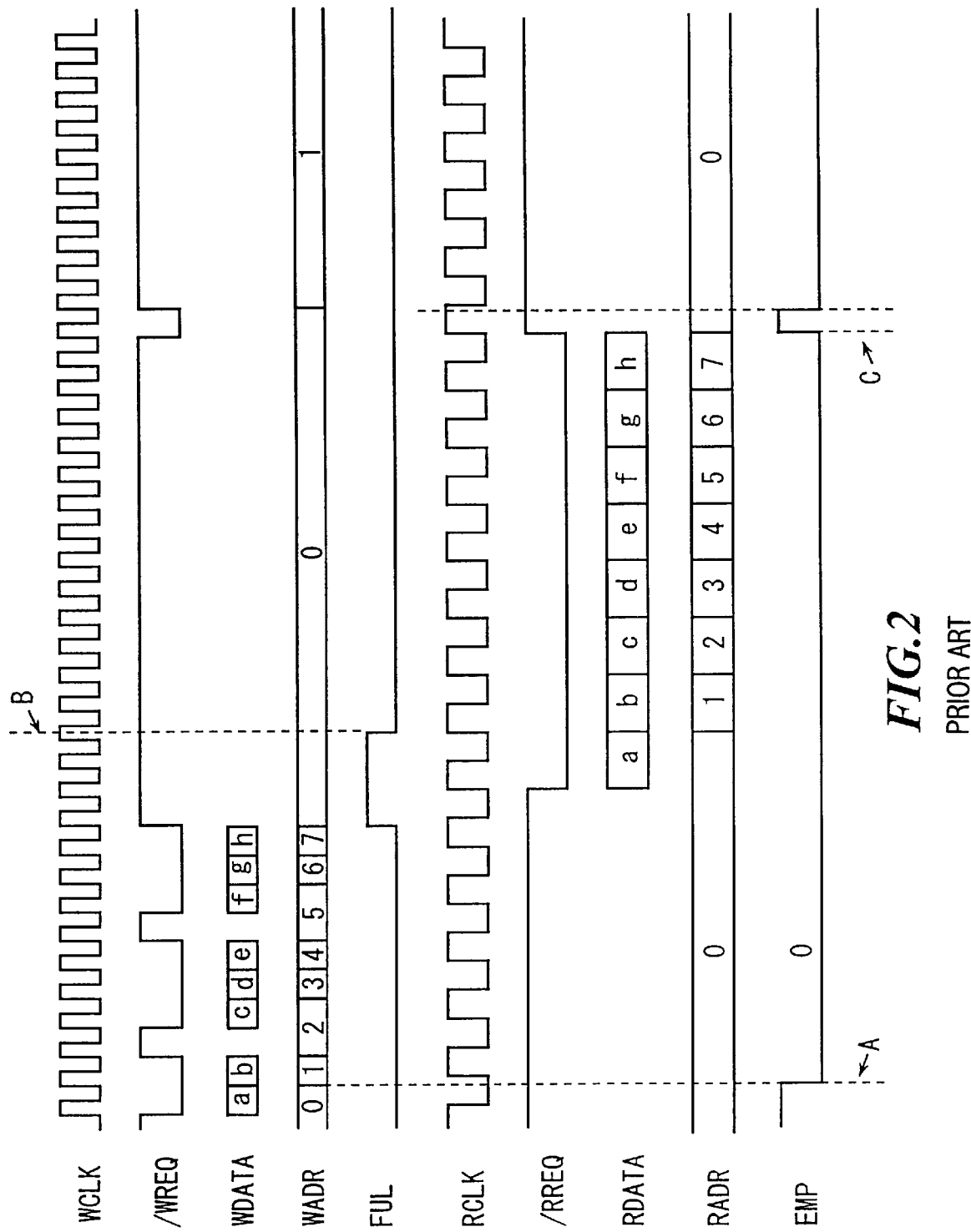
FIG. 2 is a time chart showing an exemplary operation sequence of the conventional FIFO.
Figure 7:
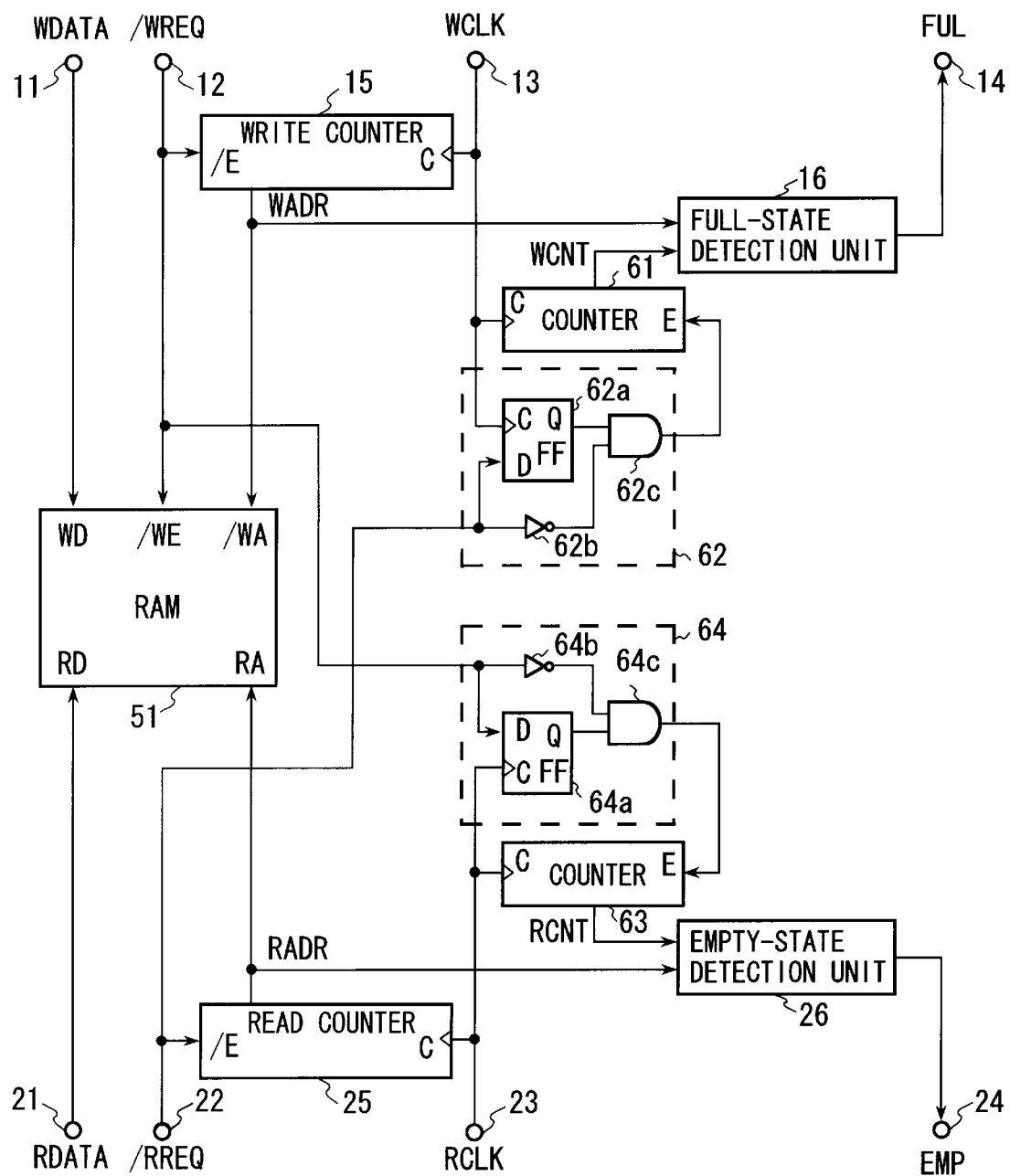
FIG. 7 is a block diagram showing the configuration of a FIFO according to the fourth embodiment of the present invention.

Next, a FIFO according to the fourth embodiment of the present invention will be explained. FIG. 7 is a block diagram showing the configuration of this FIFO. The same reference numerals are assigned to the components used in the conventional FIFO shown in FIG. 1. Such components will not be explained here. This FIFO is constructed by further installing in the conventional FIFO counters 61 and 63 and count control units 62 and 64 as exemplary synchronization circuits. The write side circuit and read side circuit connected to this FIFO have the following characteristics. The write clock signal WCLK supplied from the write side circuit and the read clock signal RCLK supplied from the read side circuit have the same frequency. The write control signal WREQ is generated by outputting a 1-pulse "L" signal for every 1-unit data write operation. The read control signal RREQ is generated by outputting a 1-pulse "L" signal for every 1-unit data read operation.

The count control unit 62 has a FF 62a, an inverter 62b, and an AND 62c. The FF 62a has a clock terminal C connected to the terminal 13, a data terminal D connected to the terminal 22, and an output terminal Q connected to one input terminal of the AND 62c. The FF 62a outputs the read control signal /RREQ from the output terminal in synchronization with the write clock signal WCLK input via the clock terminal C.

The inverter 62b has one input terminal connected to the terminal 22 and one output terminal connected to one input terminal of the AND 62c. The inverter 62b inverts the read control signal /RREQ input via the input terminal and outputs the inverted read control signal /RREQ from the output terminal.

The AND 62c has two input terminals and one output terminal. One of the two input terminals is connected to the output terminal Q of the FF 62a, and the other input terminal is connected to the output terminal of the inverter 62b. The AND 62c obtains a logic product of two values input via the two input terminals and outputs a signal that corresponds to the logic product from the output terminal.

In this way, the count control unit 62 outputs an "H" signal in synchronization with the write clock signal WCLK after the read control signal /RREQ has changed from an "H" signal to an "L" signal.

The counter 61 has a clock terminal C connected to the terminal 13, an enable terminal E connected to the output terminal of the AND 62c of the count control unit 62, and an output terminal connected to the input terminal of the full-state detection unit 16. When the signal input to the enable terminal E is an "H" signal, the counter 61 counts up the count WCNT (read correspondence address) one by one in synchronization with the rise of the write clock signal WCLK input from the clock terminal C.

Since the frequency of the write clock signal WCLK supplied from the write side circuit is equal to the frequency of the read clock signal RCLK supplied from the read side circuit and the read control signal /RREQ outputs a 1-pulse "L" for every 1-unit data read operation, this count WCNT has the same value as the read address RADR.

The count control unit 64 has a FF 64a, an inverter 64b, and an AND 64c. The FF 64a has a clock terminal C connected to the terminal 23, a data terminal D connected to the terminal 12, and an output terminal Q connected to one input terminal of the AND 64c. The FF 64a outputs the write control signal /WREQ from the output terminal in synchronization with the read clock signal RCLK input from the clock terminal C.

The inverter 64b has one input terminal connected to the terminal 12 and one output terminal connected to one input terminal of the AND 64c. The inverter 64b inverts the write control signal /WREQ input via the input terminal and outputs the inverted write control signal /WREQ from the output terminal.

The AND 64c has two input terminals and one output terminal. One of the two input terminals is connected to the output terminal Q of the FF 64a, and the other input terminal is connected to the output terminal of the inverter 64b. The AND 64c obtains a logic product of two values input via the two input terminals and outputs a signal that corresponds to the logic product from the output terminal.

In this way, the count control unit 64 outputs an "H" signal in synchronization with the read clock signal RCLK after the write control signal /WREQ has changed from an "H" signal to an "L" signal.

The counter 63 has a clock terminal C connected to the terminal 23, an enable terminal E connected to the output terminal of the AND 64c of the count control unit 64, and an output terminal connected to the input terminal of the empty-state detection unit 26. When the signal input to the enable terminal E is an "H" signal, the counter 63 counts up the count RCNT (write correspondence address) one by one in synchronization with the rise of the read clock signal RCLK input from the clock terminal C.

Since the frequency of the write clock signal WCLK supplied from the write side circuit is equal to the frequency of the read clock signal RCLK supplied from the read side circuit and the write control signal /WREQ outputs a 1-pulse "L" for every 1-unit data write operation, this count RCNT has the same value as the write address WADR.

Next, the operation of the FIFO according to the fourth embodiment will be explained. Since this FIFO reads data from the RAM 51 and writes data on the RAM 51 in the same manner as the FIFO of the first embodiment, the read and write operations of this FIFO will not be explained here.

Here, an operation for outputting a full-state signal FUL performed in parallel with the data write operation for the RAM 51 and an operation for outputting an empty-state signal EMP performed in parallel with the data read operation for the RAM 51 will be explained.

In this FIFO, after the read control signal /RREQ has changed from an "H" signal to an "L" signal, the count control unit 62 outputs an "H" signal in synchronization with the write clock signal WCLK. Next, the counter 61 counts up the count WCNT one by one in synchronization with the rise of the write clock signal WCLK and outputs the count WCNT to the full-state detection unit 16.

After the write control signal /WREQ has changed from an "H" signal to an "L" signal, the count control unit 64 outputs an "H" signal in synchronization with the read clock signal RCLK. Next, the counter 63 counts up the count RCNT one by one in synchronization with the rise of the read clock signal RCLK and outputs the count RCNT to the empty-state detection unit 26.

Thus in this FIFO, the count WCNT that corresponds to the read address RADR can be input to the full-state detection unit 16 in synchronization with the write clock signal WCLK supplied from the write side circuit. Therefore, the full-state signal FUL synchronized with the write clock signal WCLK can be output from the full-state detection unit 16. Moreover, the count RCNT that corresponds to the write address WADR can be input to the empty-state detection unit 26 in synchronization with the read clock signal RCLK supplied from the read side circuit. Therefore, the empty-state signal EMP synchronized with the read clock signal RCLK can be output from the empty-state detection unit 26.

The scope of the present invention is not limited to the above-described embodiments. In fact, various modifications and alterations of the above-described embodiments can be made. For example, the storage capacity of the RAM 51 is not limited to eight words. If the storage capacity of the RAM 51 is increased, the RAM 51 is less likely to become empty or full. As a result, data can be input and output more smoothly.

Moreover, the division ratios of the dividers 41 and 43 are not restricted to 1/4. The division ratio of the divider 41 needs not be equal to that of the divider 43. The division ratio of the divider 41 can be determined in accordance with the frequency of the write clock signal WCLK. The division ratio of the divider 43 can be determined in accordance with the frequency of the read clock signal RCLK. Furthermore, the configurations of the dividers 41 and 43 are not limited to the circuits shown in FIG. 6. Any circuit configurations that correspond to the division ratios of the dividers 41 and 43 can be adopted, respectively.

Moreover, the configurations of the count control units 62 and 64 are not limited to the circuits shown in FIG. 7. Any circuit configuration can be used for the count control unit 62, provided that the circuit can control the operation of the counter 61 holding the read control signal /RREQ in synchronization with the write clock signal WCLK. Similarly, any circuit configuration can be used for the count control unit 64, provided that the circuit can control the operation of the circuit 63 holding the write control signal /WREQ in synchronization with the read clock signal RCLK.

Furthermore, in the above-described embodiments, the write counter 15 counts the write address WADR based on the write clock signal WCLK. However, the present invention is not limited to this configuration. If the write counter 15 is configured to count the number of read operations of the read side circuit, any configuration can be used for the write counter 15. For example, when the read control signal /RREQ is configured to output a 1-pulse "L" signal for every 1-unit data read operation, the write counter 15 may be configured to count the number of pulses contained in the read control signal /RREQ.

Moreover, in the above-described embodiments, the full-state detection unit 16 detects whether the entire storage region of the RAM 51 is filled with data or not. However, the present invention is not limited to this configuration. If the full-state detection unit 16 is configured to detect whether the write operation of the write side circuit needs to be limited or not, any configuration can be used for the full-state detection unit 16. For example, the full-state detection unit 16 may be configured to detect whether the remaining storage capacity of the RAM has reached below a prescribed level or not.

Moreover, in the above-described embodiments, the empty-state detection unit 26 is configured to detect whether effective data exists in the storage region of the RAM 51 or not. However, the present invention is not limited to this configuration. If the empty-state detection unit 26 is configured to detect whether the read operation of the read side circuit needs to be limited or not, any configuration can be used for the empty-state detection unit 26. For example, the empty-state detection unit 26 may be configured to detect whether the number of data remaining in the storage region of the RAM 51 has become below a prescribed number or not.

Moreover, in the above-described embodiments, the write side circuit has a function for outputting a full-state signal and the read side circuit has a function for outputting an empty-state signal. However, only one of these two functions is needed to achieve the effect of the present invention. Moreover, by combining a function of one of these embodiments with a function of one of the other embodiments also, the effect of the present invention can be achieved.

As is clear from the explanation provided above, according to the present invention, it can be determined whether the write operation of the write side circuit needs to be restricted by outputting an appropriate signal to the write side circuit. In addition, according to the present invention, it can be determined whether the read operation of the read side circuit needs to be restricted by outputting an appropriate signal to the read side circuit. So far, the present invention has been explained using preferred embodiments. However, the range of technical applications of the present invention is not limited to these embodiments. Other variations and modifications of the above-described embodiments should be evident to those skilled in the art. Accordingly, it is intended that such alterations and modifications be included within the scope and spirit of the present invention as defined by the following claims.

What is claimed is:

1. A synchronization detection circuit provided between a first circuit that operates in synchronization with a first clock signal and a second circuit that operates in synchronization with a second clock signal that is different than the first clock signal, the synchronization detection circuit comprising:
    a first binary address generator that generates a first binary address in synchronization with the second clock signal and that outputs the first binary address;
    a first register that stores the first binary address in synchronization with the first clock signal and that outputs a first stored binary address;

a second register that stores the first stored binary address in synchronization with the first clock signal and that outputs a second stored binary address; and an agreement detector that compares the first stored binary address with the second stored binary address and that outputs a comparison result.

2. The synchronization detection circuit of claim 1, further comprising:

a second binary address generator that generates a second binary address in synchronization with the first clock signal and that outputs the second binary address;

a third register that stores the second binary address in synchronization with the second clock signal and that outputs a third stored binary address;

a fourth register that stores the third stored binary address in synchronization with the second clock signal and that outputs a fourth stored binary address; and a second agreement detector that compares the third stored binary address with the fourth stored binary address and that outputs a second comparison result.

3. A first-in first-out storage device comprising:

a memory in which data is respectively written into and read out from in synchronization with a write clock and a read clock;

a write counter that outputs a write binary address in synchronization with the write clock;

a read counter that outputs a read binary address in synchronization with the read clock;

a first divider that divides the write clock and outputs a first divided signal;

a first register that stores the write binary address in synchronization with the first divided signal and that outputs a first stored binary address;

a second divider that divides the read clock and outputs a second divided signal;

a second register that stores the read binary address in synchronization with the second divided signal and outputs a second stored binary address;

a full-state detector that compares the write binary address and the second stored binary address, detects whether or not said memory is full and outputs a first detection result;

an empty-state detector that compares the read binary address and the first stored binary address, detects whether or not said memory is empty and outputs a second detection result;

a first latch unit that outputs the first detection result in synchronization with the write clock; and a second latch unit that outputs the second detection result in synchronization with the read clock.

4. A first-in first-out storage device comprising:

a memory in which data is respectively written into and read out from in synchronization with a write clock and a read clock;

a write counter that outputs a write binary address in synchronization with the write clock;

a read counter that outputs a read binary address in synchronization with the read clock;

a first counter that counts and provides a first count result in synchronization with the write clock;

a first count control unit that provides a read control signal to said first counter in synchronization with the write clock, said first counter being enabled upon receipt of the read control signal;

a second counter that counts and provides a second count result in synchronization with the read clock;

a second count control unit that provides a write control signal to said second counter in synchronization with the read clock, said second counter being enabled upon receipt of the write control signal;

a full-state detector that compares the write binary address and the first count result and detects whether or not said memory is full; and an empty-state detector that compares the read binary address and the second count result and detects whether or not said memory is empty.

5. A first-in first-out storage device comprising:

a first circuit that operates in synchronization with a first clock signal;

a second circuit that operates in synchronization with a second clock signal that is different than the first clock signal; and a synchronization detection circuit including a first binary address generator that generates a first binary address in synchronization with the second clock signal and that outputs the first binary address, a first register that stores the first binary address in synchronization with the first clock signal and that outputs a first stored binary address, a second register that stores the first stored binary address in synchronization with the first clock signal and that outputs a second stored binary address, and an agreement detector that compares the first stored binary address with the second stored binary address and that outputs a comparison result.

6. The first-in first-out storage device of claim 5, wherein said synchronization detection circuit further comprises:

a second binary address generator that generates a second binary address in synchronization with the first clock signal and that outputs the second binary address;

a third register that stores the second binary address in synchronization with the second clock signal and that outputs a third stored binary address;

a fourth register that stores the third stored binary address in synchronization with the second clock signal and that outputs a fourth stored binary address; and a second agreement detector that compares the third stored binary address with the fourth stored binary address and that outputs a second comparison result.

7. The first-in first-out storage device of claim 5, further comprising a memory that stores data at the first binary address generated by said first binary address generator.

8. The first-in first-out storage device of claim 6, further comprising a memory that stores data at the first binary address generated by said first binary address generator and outputs data from the second binary address generated by said secondary binary address generator.

* * * * *